(12) United States Patent
Takahashi et al.

(10) Patent No.: US 6,426,018 B1
(45) Date of Patent: Jul. 30, 2002

(54) PIEZOELECTRIC CERAMIC COMPOSITIONS

(75) Inventors: Keiichi Takahashi, Nishinomiya; Masamitsu Nishida, Osaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/988,705

(22) Filed: Nov. 20, 2001

(30) Foreign Application Priority Data

Nov. 20, 2000 (JP) .......................... 2000-352935

(51) Int. Cl.$^7$ .......................... L04B 35/453
(52) U.S. Cl. .................. 252/62.9 R; 501/134; 501/135; 501/136; 501/137; 501/138
(58) Field of Search ............ 252/62.9 R; 501/134, 501/135, 136, 137, 138

(56) References Cited

U.S. PATENT DOCUMENTS 6,004,474 A * 12/1999 Takenaka et al. ...... 252/62.9 R

FOREIGN PATENT DOCUMENTS

| JP | 11-180769 | 7/1999 |
|----|-----------|--------|
| JP | 2001-48642 | 2/2001 |
| JP | 2001-151566 | 6/2001 |

* cited by examiner

Primary Examiner—Elizabeth D. Wood
(74) Attorney, Agent, or Firm—Wenderoth, Lind & Ponack, L.L.P.

(57) ABSTRACT

The present invention provides a piezoelectric ceramic composition which contains no lead and has piezoelectric characteristics suitable for practical use. The piezoelectric ceramic composition has a complex perovskite structure represented by the formula: $(1-x-y-z)BaTiO_3-x(Bi_{1/2}Na_{1/2})TiO_3-yCaTiO_3-zBa(Zn_{1/3}Nb_{2/3})O_3$ and comprises Ba, Ti, O, Bi, Na, Ca, Zn and Nb in the proportion satisfying the following conditions of x, y and z:

$0.0 < x \leq 0.90$, $0.0 \leq y \leq 0.20$, and $0.0 \leq z \leq 0.05$.

4 Claims, 1 Drawing Sheet

PIEZOELECTRIC CERAMIC COMPOSITIONS

FIELD OF THE INVENTION

The present invention relates to piezoelectric ceramic compositions for use in piezoelectric ceramic elements, and particularly to piezoelectric ceramic compositions for use in materials for piezoelectric resonators and piezo vibrators, and piezoelectric elements for use in sensors, actuators, buzzers, etc.

BACKGROUND OF THE INVENTION

Ceramic compositions comprising lead zirconate titanate (PZT) or lead titanate (PT) as main components are widely used as piezoelectric ceramic compositions for use in piezoelectric ceramic elements of piezoelectric ceramic vibrators, piezoelectric ceramic filters, piezoelectric buzzers, piezoelectric sensors and actuators. To improve the ceramic characteristics of the above compositions, traces of additives such as Mn, etc. are added, or a part of Pb is substituted with Sr or a composite oxide such as $Pb(Mg_{1/3}Nb_{2/3})O_3$ so as to obtain a piezoelectric ceramic having desired piezoelectric characteristics.

On the other hand, as for piezoelectric ceramic compositions containing no lead, $(Na,K)NbO_3$, $Bi_4Ti_3O_{12}$, etc. are known as ferroelectrics capable of exhibiting piezoelectricity, which, however, have not achieved sufficient properties in view of performance in practical use, and thus, are examined dominantly for use in sensors and actuators to be used under high temperature conditions.

The typical piezoelectric ceramic compositions such as lead zirconate titanate, etc., mainly used at present, contain Pb in large amounts which have adverse influences on the global environment. As more and more public attentions recently have been attracted to the environmental problems, the dumping of the waste of these materials induces serious problems from a view point of environmental protection. Under these circumstances, development of a material which contains no lead and has piezoelectric characteristics suitable for practical use is desired. However, at the present, there has been provided no piezoelectric ceramic composition that has piezoelectric characteristics higher than those of PZT type ceramics and PT type ceramics both of which contain Pb. Especially, a ceramic composition comprising barium titanate as a main component has been used in a restricted application such as Langevin type ultrasonic resonator or the like. However, ceramic compositions of this type are not suitable for practical use in general-purpose sensors and actuators. This is because, in case where such a composition is used for the above sensors and actuators, heating is needed to bond and set hard for junction, and because the piezoelectric ceramic composition can not be heated at a temperature higher than a Curie temperature at which its ferroelectricity is lost.

SUMMARY OF THE INVENTION

An object of the present invention is therefore to provide a piezoelectric ceramic composition which contains no lead and has piezoelectric characteristics suitable for practical use and thereby to solve the foregoing problems.

A piezoelectric ceramic composition according to the present invention has a complex perovskite structure represented by the formula:

$$(1-x-y-z)BaTiO_3\text{-}x(Bi_{1/2}Na_{1/2})TiO_3\text{-}yCaTiO_3\text{-}zBa(Zn_{1/3}Nb_{2/3})O_3 \quad (1)$$

and the composition comprises Ba, Ti, O, Bi, Na, Ca, Zn and Nb in the proportion satisfying the following conditions of x, y and z in the formula:

$$0.0 < x \leq 0.90,$$

$$0.0 \leq y \leq 0.20;$$

and $$0.0 \leq z \leq 0.05, \quad (2)$$

with the proviso that y and z are not zero at the same time (the condition of y=z=0 is excluded).

The piezoelectric ceramic composition of the present invention mentioned above contains no lead, and thus causes no environmental problem. In addition, it has a relatively large electromechanical coupling coefficient and therefore is suitably used for piezoelectric ceramic elements of piezoelectric ceramic filters, piezoelectric ceramic resonators, piezoelectric sensors, piezoelectric actuators, etc. Further, since the above piezoelectric ceramic composition has heat resistance(thermal stability) to heat of not lower than about 150° C., it becomes possible to construct a piezoelectric element using adhesive having a setting temperature of 150° C. In this regard, the above numerical range of x extrudes 0 and 1.0, because the single use of a known simple $BaTiO_3$ or $(Bi_{1/2}Na_{1/2})TiO_3$ is hard to provide a piezoelectric ceramic composition having heat resistance(thermal stability) sufficient for practical use. While the piezoelectric ceramic compositions of the present invention are represented by the formula (1), such compositions include not only compositions comprising independent phases of $BaTiO_3$, $(Bi_{1/2}Na_{1/2})TiO_3$, $CaTiO_3$ and $Ba(Zn_{1/3}Nb_{2/3})O_3$, but also compositions of the above formula in which, at least, the respective atoms, Ba, Ti, O, Bi, Na, Ca, Zn and Nb are contained in the proportion satisfying the above conditions of numerical ranges (2) and in which these atoms constitutes a perovskite structure represented by $ABO_3$.

It is preferable that the piezoelectric ceramic composition comprises $MnO_2$ as a sub-component at a content of 0.01 to 1.0 wt. %. This is because, out of piezoelectric characteristics, particularly a mechanical quality factor (the acuteness of mechanical vibration at a resonance frequency) can be improved.

Also, it is preferable that the piezoelectric ceramic composition comprises a rare earth oxide such as $Y_2O_3$ as a sub-component at a content of 0.01 to 1.0 wt. %. This is because the time dependent change(a change with the passage of time) in capacity can be decreased, which leads to an improvement on the stability of piezoelectric characteristics with time.

The addition of the sub-components, that is, $MnO_2$ and a rare earth oxide such as $Y_2O_3$ is effective to further improve the piezoelectric characteristics, and it is preferable that any of such sub-components should be added in an amount of not more than 1.0wt. %, because the addition of not less than 1.0wt. % of such a sub-component has a danger of degrading the characteristics as piezoelectric ceramics.

DETAILED DESCRIPTION OF THE PREFERRED EMBODIMENTS

Figure 1:
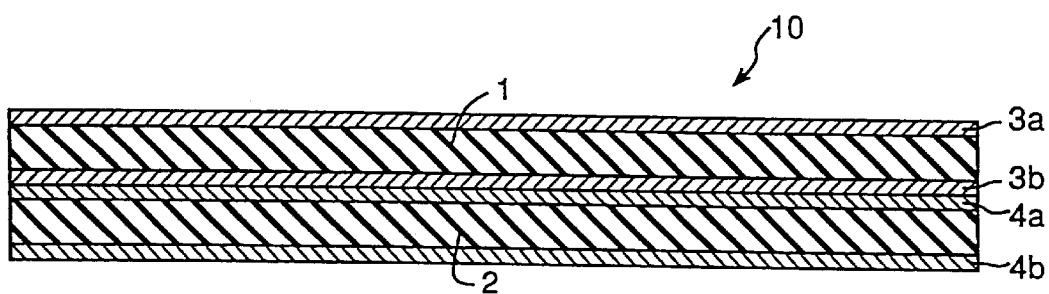
FIG. 1 is a sectional view of an actuator (10) comprising a piezoelectric ceramic composition according to the present invention.

With reference to FIG. 1, the actuator (10) comprises a piezoelectric ceramics (1) having electrodes (3a) and (3b) formed on both side thereof, and a piezoelectric ceramics (2) having electrodes (4a) and (4b) formed on both side thereof.

Any of the piezoelectric ceramics (1) and (2) is formed from a piezoelectric ceramic composition according to the present invention. The electrode (3b) formed on the piezoelectric ceramics (1) is fixed to the electrode (4a) formed on the piezoelectric ceramics (2) with an adhesive to constitute an integrated body for forming the actuator (10). The piezoelectric ceramic composition of the present invention is described below.

The piezoelectric ceramic composition of the present invention has a complex perovskite structure ($ABO_3$) based on $BaTiO_3$. The piezoelectric ceramic composition of the present invention is represented by the formula:

$$(1-x-y-z)BaTiO_3\text{-}x(Bi_{1/2}Na_{1/2})TiO_3\text{-}yCaTiO_3\text{-}zBa(Zn_{1/3}Nb_{2/3})O_3 \quad (1)$$

wherein the values of x, y and z are within the following ranges, respectively:

$$0.0 < x \leq 0.90,$$

$$0.0 \leq y \leq 0.20$$

and $$0.0 \leq z \leq 0.05 \quad (2)$$

(with the proviso that y and z are not zero at the same time (the condition of y=z=0 is excluded)).

In the perovskite structure represented by the formula of $ABO3$ the site A is a position on which Ba, Bi, Na and Ca can be present, and the site B is a position on which Ti, Zn and Nb can be present. The above piezoelectric ceramic composition of the present invention contains no lead and thus has no danger to cause the environmental problems.

It is difficult to raise the firing temperature of a pure $BaTiO_3$ because its firing temperature range is narrow. As a result, the obtained ceramics can not have a sufficient sintered density, which causes a problem in that, when this ceramics is subjected to a polarization treatment so as to be functioned as a piezoelectric material, the yield thereof disadvantageously tends to decrease. This is because the ceramics can not withstand a high electric field applied in the polarization treatment. On the other hand, the piezoelectric ceramic composition of the present invention prepared by substituting the site A or the site B with an element which less degrades the characteristics can be fired within a wider temperature range, which makes it possible to fire the composition at a temperature which provides a highest sintered density. Thus, the resultant ceramics can have a higher sintered density. Accordingly, the use of the piezoelectric ceramic composition of the present invention makes it possible to achieve high voltage resistance.

Therefore, the piezoelectric ceramic composition of the present invention is suitable as a material of piezo resonators and piezo vibrators for use in sensors, actuators and vibrators, in view of its wider firing temperature range, and the construction of piezoelectric elements becomes easy by using the piezoelectric ceramic composition of the present invention.

In addition, the conventional piezoelectric ceramic composition composed of $BaTiO_3$ has a relatively low Curie temperature (127° C.) being a critical temperature at which a material loses piezoelectricity, and this composition has not sufficient heat resistance(thermal stability) in this view of point. On the other hand, the piezoelectric ceramic composition of the present invention is prepared by adding $(Bi_{1/2}Na_{1/2})TiO_3$, and therefore can have a higher Curie temperature and also can have heat resistance(thermal stability) to heat of not lower than about 150° C. Therefore, it becomes possible to construct a piezoelectric element using adhesive having a setting temperature of about 150° C., and even in such a case, the piezoelectric ceramic composition of the present invention does not degrade.

When the piezoelectric ceramic composition of the present invention further contains $CaTiO_3$, a more stable perovskite crystalline structure can be formed. This is because, as described above, the lower limit of the firing temperature range is decreased by substituting the site A with Ca to thereby widen the firing temperature range. Also, by adding $Ba(Zn_{1/3}Nb_{2/3})O_{31}$ the dielectric constant of the composition can be raised, which contributes to miniaturization of a piezoelectric element.

Since the piezoelectric ceramic composition, represented by the above formula, of the present invention has a relatively large electromechanical coupling coefficient (a square root of a rate of conversion of a given electrical input into a mechanical output, which indicates a capacity of electric-mechanical conversion), the piezoelectric ceramic composition of the present invention can be practically used for piezoelectric ceramic filters, piezoelectric ceramic vibrators, piezoelectric sensors, piezoelectric actuators, etc.

Further, in case where the above piezoelectric ceramic composition contains 0.01 to 1.0 wt. % of $MnO_2$, pariticularly the mechanical quality factor out of the piezoelectric characteristics can be improved, and thus, such a composition can provide excellent piezoelectric characteristics as a piezoelectric ceramics for use in sensors.

Furthermore, in case where the above piezoelectric ceramic composition contains 0.01 to 1.0 wt. % of a rare earth oxide such as $Y_2O_3$, the rate of change in capacity with time can be decreased, and thus, such a composition can provide improved stability of piezoelectric characteristics with time.

EXAMPLES

Hereinafter, Examples of the present invention will be described in more detail. Piezoelectric ceramic compositions according to the present invention, however, are not limited to the formulations of the samples described in the following Examples, and they can provide similar effects in so far as their formulations are changed within the above-mentioned ranges (2).

Example 1

A piezoelectric ceramic composition according to Example 1 was prepared as follows. First, $BaCO_3$, $Bi_2O_3$, $NaCO_3$, $CaCO_3$, $TiO_2$ and $MnCO_3$ as starting raw materials were weighed so that a finally obtained piezoelectric ceramics could have a given formulation ratio indicated in Table 1, and they were homogeneously mixed in a ball mill. Next, the resultant composition was calcined at a temperature of 800 to 1,000° C. for 2 hours to form a compound. The compound was ground again in the ball mill, and polyvinyl alcohol was added to the particles of the compound, and the mixture was granulated. The granulated powder was subjected to uniaxial compression molding under a pressure of 70 MPa to form a disc with a diameter of 13 mm, which was then fired at a temperature of 1,000 to 1,400° C. for 2 hours.

This disc sample was polished to a thickness of 0.3 mm, and Ag was baked onto the disc sample at 700° C. to form an electrode thereon. After that, the disc sample was subjected to a polarization treatment by applying an electric field of 3 to 5 KV/mm thereto in a silicone oil of 80° C. for 30 minutes. Piezoelectric ceramics of Sample Nos. 1 to 7 and those of Comparative Examples 1 to 4 were obtained in this manner.

The specific dielectric constants $\epsilon_r$, tan δ, coupling coefficients $k_p$ in disc radial direction spreading vibration mode, coupling coefficients $k_t$ in disc thickness direction vertical vibration mode, mechanical quality factors $Q_M$ and piezoelectric constants $d_{31}$ of the piezoelectric ceramics of Sample Nos. 1 to 7 and Comparative Example 1 to 4 were determined, and Curie points $T_c$ thereof at which the piezoelectricity of the piezoelectric ceramics was lost were determined based on a change in dielectric constant depending on temperature, by finding temperatures at which the dielectric constants became maximal values. The results are shown in Tables 1 and 2. In this connection, the values included in the parentheses on the column showing the Curie points $T_c$ indicate transformation points into AF phases (antiferroelectricity). Since piezoelectricity is lost at this transformation point, the transformation point can be used as a criterion of heat resistance(thermal stability) as well as a Curie point $T_c$.

For comparison, a sample of a pure barium titanate used in a conventional piezoelectric ceramic composition (Comparative Example 1), samples of a pure sodium bismuthate titanate (Comparative Examples 2 and 3), and a sample of a composition of the formula in which x was zero (Comparative Example 4) were prepared, and the measurement results thereof are also shown in Tables 1 and 2.

TABLE 1

|  | BaTiO$_3$ 1-x-y-z | (Bi$_{1/2}$Na$_{1/2}$)TiO$_3$ x | CaTiO$_3$ y | MnO$_2$ (wt. %) |
|---|---|---|---|---|
| Sample 1 | 0.05 | 0.90 | 0.05 | 0.5 |
| Sample 2 | 0.90 | 0.05 | 0.05 | 0.0 |
| Sample 3 | 0.85 | 0.10 | 0.05 | 0.0 |
| Sample 4 | 0.80 | 0.10 | 0.10 | 0.0 |
| Sample 5 | 0.70 | 0.10 | 0.20 | 0.0 |
| Sample 6 | 0.70 | 0.20 | 0.10 | 0.0 |
| Sample 7 | 0.60 | 0.20 | 0.20 | 0.0 |
| Com. Ex. 1 | 1.00 | 0.00 | 0.00 | 0.0 |
| Com. Ex. 2 | 0.00 | 1.00 | 0.00 | 0.0 |
| Com. Ex. 3 | 0.00 | 1.00 | 0.00 | 0.5 |
| Com. Ex. 4 | 0.95 | 0.00 | 0.05 | 0.0 |

TABLE 2

|  | $\epsilon_r$ | tan δ | $k_p$ | $k_t$ | $Q_M$ | $d_{31}$ (E-11m/V) | $T_c$ (° C.) |
|---|---|---|---|---|---|---|---|
| Sample 1 | 668 | 0.015 | 0.138 | 0.459 | 375 | 1.89 | (180) |
| Sample 2 | 481 | 0.027 | 0.217 | 0.451 | 124 | 3.22 | 154 |
| Sample 3 | 505 | 0.023 | 0.211 | 0.327 | 110 | 3.45 | 183 |
| Sample 4 | 512 | 0.021 | 0.205 | 0.343 | 132 | 3.24 | 181 |
| Sample 5 | 455 | 0.023 | 0.205 | 0.351 | 149 | 2.2 | 157 |
| Sample 6 | 442 | 0.025 | 0.188 | 0.357 | 137 | 1.69 | 165 |
| Sample 7 | 406 | 0.025 | 0.171 | 0.366 | 130 | 1.6 | 167 |
| Com. Ex. 1 | 1190 | 0.026 | 0.201 | 0.321 | 112 | 3.18 | 127 |
| Com. Ex. 2 | 402 | 0.022 | 0.185 | 0.441 | 113 | 2.08 | (190) |
| Com. Ex. 3 | 335 | 0.02 | 0.130 | 0.438 | 816 | 1.4 | (190) |
| Com. Ex. 4 | 1065 | 0.048 | 0.197 | 0.445 | 111 | 3.5 | 139 |

It was known from Tables 1 and 2 that the piezoelectric ceramics of Sample Nos. 1 to 7 had Curie points, as criteria of heat resistance(thermal stability), of not lower than 150° C. and sufficiently large electromechanical coupling coefficients $k_p$ and $k_t$. In contrast, the piezoelectric ceramics of Comparative Example 4 had a Curie point of lower than 150° C. Accordingly, the piezoelectric ceramic composition of Comparative Example 4 lost peizoelectricity at a temperature of lower than 150° C. and thus was found to have insufficient heat resistance(thermal stability) as well as the sample of the pure barium titanate (Comparative Example 1).

While the piezoelectric ceramics of Comparative Example 1 could have a relative sintered density of 96% only within a firing temperature range of 1,500°±15° C., the piezoelectric ceramics of, for example, Sample No. 1 as a substituted solid solution containing a different element had a relative sintered density of not lower than 96.5% within a baking temperature range of 1,330°±30° C.

As has been understood from the above facts, it becomes easy to form the piezoelectric ceramics of Sample Nos. 1 to 7 which were the solid solutions of (Bi$_{1/2}$Na$_{1/2}$)TiO$_3$ and CaTiO$_3$ in BaTiO$_3$ and which contained no lead, within wider firing temperature ranges. In addition, it was known that the piezoelectric ceramics of Sample Nos. 1 to 7 of the present Example had sufficient heat resistance(thermal stability) and electromechanical coupling coefficients $k_p$ and $k_t$. Accordingly, as in the piezoelectric ceramics of Sample Nos. 1 to 7, the piezoelectric ceramic compositions of the formula (1) in which the values of x and y are $0.0 < x \leq 0.90$ and $0.0 \leq y \leq 0.20$, respectively, have sufficient heat resistance(thermal stability) and sufficient electromechanical coupling coefficients $k_p$ and $k_t$ and therefore can be suitably used for piezoelectric elements in a variety of applications. Furthermore, the piezoelectric ceramics of Sample No. 1 which contained MnO$_2$ had an increased mechanical quality factor $Q_M$ as shown in Tables 1 and 2 and therefore can be suitably used for particularly sensors and actuators which are required to be constructed using a material having a large mechanical quality factor $Q_M$.

Example 2

A piezoelectric ceramic composition according to Example 2 was prepared as follows. First, BaCO$_3$, Bi$_2$O$_3$, NaCo$_3$, CaCO$_3$, TiO$_2$, ZnO, Nb$_2$O$_5$ and MnCO$_3$ as starting raw materials were weighed so that a finally obtained piezoelectric ceramics could have a formulation ratio indicated in Table 3, and they were homogeneously mixed in a ball mill. Next, the resultant composition was calcined at a temperature of 800 to 1,000° C. for 2 hours to form a compound. The compound was ground again in the ball mill, and polyvinyl alcohol was added to the grains of the compound, and the mixture was granulated. The resultant powder was subjected to uniaxial compression molding under a pressure of 70 MPa to form a disc with a diameter of 13 mm, which was then baked at a temperature of 1,200 to 1,400° C. for 2 hours. This disc sample was polished to a thickness of 0.3 mm, and Ag was baked onto the disc sample at 700° C. to form an electrode thereon. After that, the disc sample was subjected to a polarization treatment by applying an electric field of 3 to 5 KV/mm thereto in a silicone oil of 80° C. for 30 minutes. Piezoelectric ceramics of Sample Nos. 8 to 14 were obtained in this manner.

The specific dielectric constants $\epsilon_r$, tan 67 , coupling coefficients $k_p$ in disc radial direction spreading vibration mode, coupling coefficients $k_t$ in disc thickness direction vertical vibration mode, mechanical quality factors $Q_M$, piezoelectric constants $d_{31}$, and Curie points $T_c$ of the piezoelectric ceramics of Sample Nos. 8 to 14 were determined in the same manner as in Example 1. The measurement results thereof are shown in Table 4.

TABLE 3

|  | BaTiO$_3$ 1-x-y-z | (Bi$_{1/2}$Na$_{1/2}$)TiO$_3$ x | CaTiO$_3$ y | Ba(Zn$_{1/3}$Nb$_{2/3}$)O$_3$ z | MnO$_2$ (wt. %) |
| --- | --- | --- | --- | --- | --- |
| Sample 8 | 0.84 | 0.10 | 0.05 | 0.01 | 0.0 |
| Sample 9 | 0.49 | 0.50 | 0.00 | 0.01 | 0.0 |
| Sample 10 | 0.14 | 0.80 | 0.05 | 0.01 | 0.0 |
| Sample 11 | 0.14 | 0.85 | 0.00 | 0.01 | 0.0 |
| Sample 12 | 0.14 | 0.85 | 0.00 | 0.01 | 1.0 |
| Sample 13 | 0.73 | 0.15 | 0.10 | 0.02 | 0.0 |
| Sample 14 | 0.78 | 0.20 | 0.00 | 0.02 | 0.0 |
| Com. Ex. 5 | 0.98 | 0.00 | 0.00 | 0.02 | 0.0 |
| Com. Ex. 6 | 0.93 | 0.00 | 0.05 | 0.02 | 0.0 |
| Com. Ex. 7 | 0.78 | 0.00 | 0.20 | 0.02 | 0.0 |
| Com. Ex. 8 | 0.60 | 0.20 | 0.15 | 0.05 | 0.0 |

TABLE 4

|  | $\epsilon_r$ | tan δ | $k_p$ | $k_t$ | $Q_M$ | $d_{31}$ (E-11m/V) | $T_c$ (°C.) |
| --- | --- | --- | --- | --- | --- | --- | --- |
| Sample 8 | 468 | 0.023 | 0.176 | 0.345 | 117 | 2.14 | 150 |
| Sample 9 | 453 | 0.024 | 0.153 | 0.353 | 89 | 1.58 | 223 |
| Sample 10 | 793 | 0.025 | 0.195 | 0.428 | 83 | 2.42 | 238 |
| Sample 11 | 836 | 0.023 | 0.198 | 0.435 | 87 | 2.44 | 244 |
| Sample 12 | 634 | 0.013 | 0.126 | 0.442 | 376 | 1.82 | 245 |
| Sample 13 | 461 | 0.023 | 0.216 | 0.382 | 120 | 2.28 | 155 |
| Sample 14 | 436 | 0.024 | 0.207 | 0.321 | 132 | 2.03 | 166 |
| Com. Ex. 5 | 2700 | 0.025 | — | — | — | — | 96 |
| Com. Ex. 6 | 2414 | 0.024 | 0.165 | 0.238 | 189 | 4.6 | 102 |
| Com. Ex. 7 | 1579 | 0.103 | 0.182 | 0.279 | 136 | 3.6 | 115 |
| Com. Ex. 8 | 1075 | 0.033 | 0.188 | 0.329 | 134 | 3.27 | 123 |

It was known from Tables 3 and 4 that the piezoelectric ceramics of Sample Nos. 8 to 14 had Curie points of not lower than 150° C. and higher heat resistance(thermal stability) than those of the piezoelectric ceramics of Comparative Examples 5 to 8, and also had relatively large electromechanical coupling coefficients $k_p$ and $k_t$. The piezoelectric ceramics of Comparative Example 8{z(content of Ba(Zn$_{1/3}$Nb$_{2/3}$)O$_3$, is set 0.05} had an excessively lowered Curie point, and therefore was unsuitable for use.

As is understood from the above results, the piezoelectric ceramics, containing no lead, of Sample Nos. 8 to 14, which were formed as solid solutions of (Bi$_{1/2}$Na$_{1/2}$)TiO$_3$, CaTio$_3$ and Ba(Zn$_{1/3}$Nb$_{2/3}$)O$_3$ resistance(thermal stability) and sufficient electromechanical coupling coefficients $k_p$ and $k_t$. Therefore, the piezoelectric ceramics of Sample Nos. 8 to 14 of the present Example can be suitably used for various piezoelectric elements because the piezoelectric ceramic compositions of the formula (1) in which the values of x, y and z are 0.0<x≦0.90, 0.0≦y≦0.20 and 0.0≦z<0.05, respectively, have sufficient heat resistance(thermal stability) and sufficient electromechanical coupling coefficients $k_p$ and $k_t$.

In addition, the piezoelectric ceramics of Sample No. 12 containing 1.0 wt. % of MnO$_2$ had an increased mechanical quality factor $Q_M$ as shown in Table 4 and therefore can be suitably used for particularly sensors and actuators which are required to be constructed using a material having a large mechanical quality factor $Q_M$.

Example 3

A piezoelectric ceramic composition according to Example 3 was prepared as follows. First, BaCO$_3$, Bi$_2$O$_3$, NaCo$_3$, CaCO$_3$, TiO$_2$, MnCO$_3$, Y$_2$O$_3$, Dy$_2$O$_3$, Ho$_2$O$_3$ and Yb$_2$O$_3$ as starting raw materials were weighed so that a finally obtained piezoelectric ceramics could have a formulation ratio indicated in Table 5, and they were homogeneously mixed in a ball mill. Next, the resultant composition was calcined at a temperature of 800 to 1,000° C. for 2 hours to form a compound. The compound was ground again in the ball mill, and polyvinyl alcohol was added to the grains of the compound, and the mixture was granulated. The resultant powder was subjected to uniaxial compression molding under a pressure of 70 MPa to form a disc with a diameter of 13 mm, which was then baked at a temperature of 1,200 to 1,400° C. for 2 hours.

This disc sample was polished to a thickness of 0.3 mm, and Ag was baked onto the disc sample at 700° C. to form an electrode thereon. After that, the disc sample was subjected to a polarization treatment by applying an electric field of 3 to 5 KV/mm thereto in a silicone oil of 80° C. for 30 minutes. Piezoelectric ceramics of Sample Nos. 15 to 20 were obtained in this manner.

The specific dielectric constants $\epsilon_r$, tan δ, coupling coefficients $k_p$ in disc radial direction spreading vibration mode, coupling coefficients $k_t$ in disc thickness direction vertical vibration mode, mechanical quality factors $Q_M$ and rates of change in capacity found after 1,000. hours had passed, of the piezoelectric ceramics of Sample Nos. 15 to 20 were determined in the same manner as in Example 1. The measurement results thereof are shown in Table 6.

TABLE 5

|  | BaTiO$_2$ 1-x-y-z | (Bi$_{1/2}$Na$_{1/2}$)TiO$_3$ x | CaTiO$_3$ y | MnO$_2$ (wt. %) | Rare earth oxide Type | Amount (wt %) |
| --- | --- | --- | --- | --- | --- | --- |
| Sample 15 | 0.10 | 0.85 | 0.05 | 0.50 | — | 0.0 |
| Sample 16 | 0.10 | 0.85 | 0.05 | 0.50 | Y$_2$O$_3$ | 0.5 |
| Sample 17 | 0.10 | 0.85 | 0.05 | 0.50 | Y$_2$O$_3$ | 1.0 |
| Sample 18 | 0.10 | 0.85 | 0.05 | 0.50 | Dy$_2$O$_3$ | 0.5 |
| Sample 19 | 0.10 | 0.85 | 0.05 | 0.50 | Ho$_2$O$_3$ | 0.5 |

TABLE 5-continued

| | BaTiO$_2$ 1-x-y-z | (Bi$_{1/2}$Na$_{1/2}$)TiO$_3$ x | CaTiO$_3$ y | MnO$_2$ (wt. %) | Rare earth oxide Type | Rare earth oxide Amount (wt %) |
|---|---|---|---|---|---|---|
| Sample 20 | 0.10 | 0.85 | 0.05 | 0.50 | Yb$_2$O$_3$ | 0.5 |
| Com. Ex. 9 | 0.10 | 0.85 | 0.05 | 0.50 | Y$_2$O$_3$ | 1.5 |

TABLE 6

| | $\epsilon_r$ | tan δ | k$_p$ | k$_t$ | Q$_M$ | Rate of change in capacity after 1000 hr. (%) |
|---|---|---|---|---|---|---|
| Sample 15 | 617 | 0.012 | 0.143 | 0.446 | 398 | −0.98 |
| Sample 16 | 634 | 0.012 | 0.142 | 0.435 | 427 | −0.53 |
| Sample 17 | 637 | 0.015 | 0.126 | 0.436 | 404 | −0.48 |
| Sample 18 | 627 | 0.012 | 0.138 | 0.433 | 425 | −0.50 |
| Sample 19 | 627 | 0.012 | 0.139 | 0.436 | 415 | −0.53 |
| Sample 20 | 624 | 0.012 | 0.140 | 0.435 | 410 | −0.50 |
| Com. Ex. 9 | 654 | 0.045 | 0.050 | 0.165 | 40 | −0.58 |

It was known from Tables 5 and 6 that, when the piezoelectric ceramics of Sample Nos. 16 to 20 and that of Sample No. 15 were compared in view of the rate of change in capacity after 1,000 hours had passed, the addition of the rare earth oxides were effective to lower the rate of change in capacity with time, as seen in the piezoelectric ceramics of Sample Nos. 16 to 20. However, as seen in the piezoelectric ceramics of Comparative Example 9 which contained the rare earth oxide, if the amount of the rare earth oxide was 1.5 wt. %, the resultant piezoelectric ceramics had decreased coupling coefficients k$_p$ and k$_t$ and a decreased mechanical quality factor Q$_M$. In contrast, since the piezoelectric ceramics of Sample Nos. 16 to 20 contained not more than 1.0 wt. % of rare earth oxides, the mechanical quality factors Q$_M$ improved by the addition of MnO$_2$ were not lowered. In this connection, although not shown in Table 6, any of the Curie points of the piezoelectric ceramics of Sample Nos. 15 to 20 was not lower than 150° C.

Some electric materials for use in sensors are required to have large mechanical quality factors Q$_M$ and also have stability against changes with time. In view of these requirements, the use of the piezoelectric ceramics of Sample Nos. 16 to 20 of the present Example 3 which contained 1.0 wt. % or less of the rare earth oxides in addition to 0.5 wt. % of MnO$_2$ is effective to provide especially practical sensors and actuators.

As has been described above, the piezoelectric ceramic compositions according to the present invention contain no lead which has induced the environmental problems so far, and have relatively large electromechanical coupling coefficients and sufficient heat resistance(thermal stability). Therefore, these piezoelectric ceramic compositions are useful, for example, as materials for piezoelectric elements of sensors, actuators, piezoelectric vibrators, filters, etc.

What is claimed is:

1. A piezoelectric ceramic composition having a complex perovskite structure represented by the formula:

$$(1-x-y-z)BaTiO_3-x(Bi_{1/2}Na_{1/2})TiO_3-yCaTiO_3-zBa(Zn_{1/3}Nb_{2/3})O_3$$

wherein said composition comprises Ba, Ti, O, Bi, Na, Ca, Zn and Nb in the proportion satisfying the following conditions of x, y and z:

$$0.0 < x \leq 0.90,$$

$$0.0 \leq y \leq 0.20,$$

and $$0.0 \leq z \leq 0.05,$$

with the proviso that y and z are not zero at the same time (the condition of y=z=0 is excluded).

2. A piezoelectric ceramic composition according to claim 1, which comprises 0.01 wt. % to 1.0 wt. % of MnO$_2$.

3. A piezoelectric ceramic composition according to claim 1, which comprises 0.01 wt. % to 1.0 wt. % of a rare earth oxide.

4. A piezoelectric ceramic composition according to claim 2, which comprises 0.01 wt. % to 1.0 wt. % of a rare earth oxide.

* * * * *